United States Patent
Yamamoto

[19]

[11] Patent Number: 6,097,254
[45] Date of Patent: Aug. 1, 2000

[54] OUTPUT POWER AMPLIFIER CIRCUIT WITH SHORT-CIRCUIT PROTECTIVE FUNCTION

[75] Inventor: Hiroyuki Yamamoto, Yokohama, Japan

[73] Assignee: Kabushiki Kaisha Toshiba, Kawasaki, Japan

[21] Appl. No.: 09/249,137

[22] Filed: Feb. 12, 1999

[30] Foreign Application Priority Data

Feb. 12, 1998 [JP] Japan ................................ 10-030002

[51] Int. Cl.$^7$ ............................. H02H 7/20; H03F 3/18; H03F 3/26
[52] U.S. Cl. .......................... 330/298; 330/263; 330/267
[58] Field of Search ................................ 330/207 P, 263, 330/267, 298

[56] References Cited

U.S. PATENT DOCUMENTS

| | | | |
|---|---|---|---|
| 4,216,517 | 8/1980 | Takahashi | 330/207 P |
| 4,258,406 | 3/1981 | Seki | 330/298 |
| 4,509,101 | 4/1985 | Kenji | 330/207 P |
| 4,564,879 | 1/1986 | Bienstman | 330/207 P |
| 5,847,610 | 12/1998 | Fujita | 330/298 |

FOREIGN PATENT DOCUMENTS

1-220915  9/1989  Japan .

*Primary Examiner*—Robert Pascal
*Assistant Examiner*—Patricia T. Nguyen
*Attorney, Agent, or Firm*—Oblon, Spivak, McClelland, Maier & Neustadt, P.C.

[57] ABSTRACT

A load short-circuit protective circuit device having broad protective operation range and capable of maintaining protective operation until short-circuit of output transistors is released (reset) without using thyristor circuit has an output transistor for generating power amplified signal, detection circuit for detecting a collector current and a collector voltage of the output transistor; and a protective operation circuit for performing protective operation for the output transistor when the current detected by the detection circuit reach predetermined current value and the voltage detected by the detection circuit enters within a set value range.

20 Claims, 9 Drawing Sheets

OUTPUT POWER AMPLIFIER CIRCUIT WITH SHORT-CIRCUIT PROTECTIVE FUNCTION

This invention relates to an output power amplifier circuit with a short-circuit protective function, which is preferably employed in an output power amplifier circuit in a semiconductor integrated circuit device.

Figure 6A:
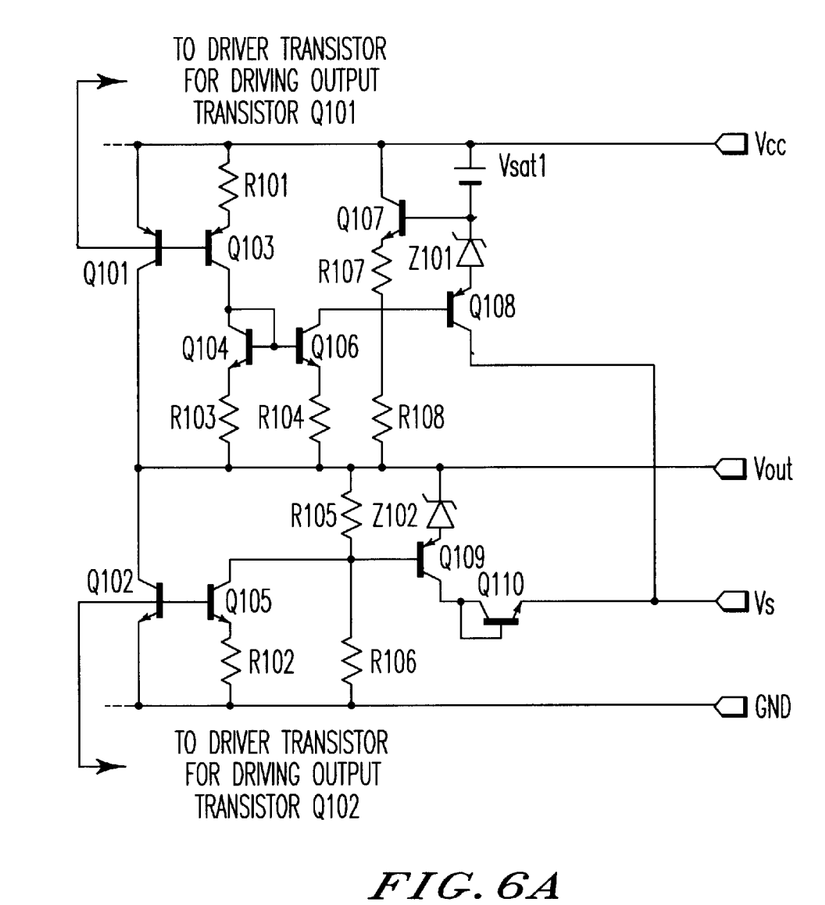
FIG. 6 is a circuit diagram showing one example of the configuration of a conventional output power amplifier circuit.
Figure 6B:
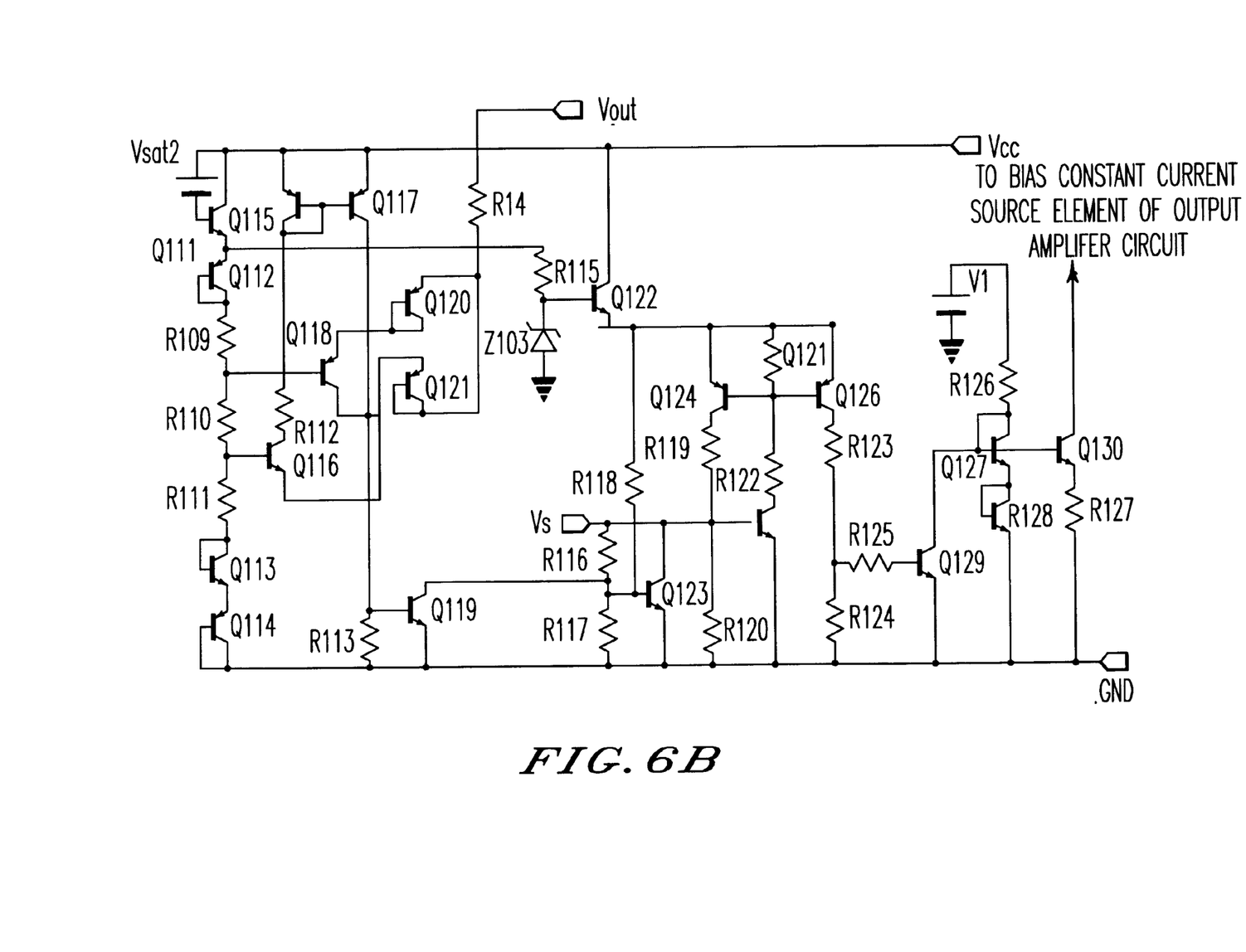

FIG. 6 is a circuit diagram showing an example of the configuration of a conventional output power amplifier circuit with a short-circuit protective function.

Connections in the conventional output power amplifier shown in FIG. 6 are described as follows: A PNP transistor Q101 and an NPN transistor Q102 are connected in series in order recited between a power supply potential node Vcc and a ground potential node GND, and connecting point (node) of collector of the PNP transistor Q101 and collector of the NPN transistor Q102 is caused to serve as output potential node Vout. The transistors Q101 and Q102 are respectively output transistors of the class B push-pull output power amplifier circuit as described later and bases of the transistors Q101 and Q102 are respectively connected to driver transistors for driving the transistors Q101 and Q102.

A resistor R101, a PNP transistor Q103, and NPN transistor Q104 and a resistor R103 which are connected in series in order recited are connected in parallel with the PNP transistor Q101. Bases of the PNP transistors Q101 and Q103 are connected to each other, and base and collector of the NPN transistor Q104 are connected to each other. An NPN transistor Q107 and resistors R107 and R108 which are connected in series in order recited are also connected in parallel with the PNP transistor Q101. An NPN transistor Q106 and a resistor R4 which are connected in series in order recited are connected in parallel with the resistor R108, and base of the NPN transistor Q106 and base of the NPN transistor Q104 are connected to each other. A d.c. voltage source Vsat1, a Zener diode Z101 and a PNP transistor Q108 are connected in series in order recited between the power supply potential node Vcc and a node Vs.

A resistor R105, an NPN transistor Q105 and a resistor R102 which are connected in series in order are connected in parallel with the NPN transistor Q102, and a resistor R6 is connected in parallel with the NPN transistor Q105 and the resistor R2. Bases of the NPN transistors Q102 and Q105 are connected to each other. A Zener diode Z102, a NPN transistor Q109 and an NPN transistor Q110 are connected in series in order recited between output potential node Vout and the node Vs. Base of the NPN transistor Q109 is connected to collector of the NPN transistor Q105, and base and collector of the NPN transistor Q110 are connected to each other.

Moreover, an NPN transistor Q111, a PNP transistor Q112, resistor R109, R110, R111, and NPN transistor Q113 and a PNP transistor Q114 are connected in series in order recited between the power supply potential node Vcc and the ground potential node GND, a d.c. voltage source Vsat2 is connected between base and collector of the NPN transistor Q111, and bases and collectors of the PNP transistor Q112, the NPN transistor Q113 and the PNP transistor Q114 are respectively connected to each other. A resistor R115 and a Zener diode Z103 are connected in series in order recited between the node of emitter of the NPN transistor Q111 and emitter of the PNP transistor Q112 and the ground potential terminal (node) GND.

A PNP transistor Q115, a resistor R112, an NPN transistor Q116, a PNP transistor Q121, a resistor R114 are connected in series in order recited between the power supply potential node Vcc and the output potential node Vout. Base and collector of the PNP transistor Q115 are connected to each other, base of the NPN transistor Q116 is connected to node of resistors R110 and R111, and base and collector of the PNP transistor Q121 are connected to each other.

A PNP transistor Q117 and a resistor R113 are connected in series in order recited between the power supply potential node Vcc and the ground potential node GND, and a PNP transistor Q120 and a PNP transistor Q118 are connected in series in order recited between collector of the PNP transistor Q121 and collector of the PNP transistor Q117. Base of the PNP transistor Q117 is connected to base of the PNP transistor Q115, base and collector of the PNP transistor Q120 are connected to each other, and base of the PNP transistor Q118 is connected to node of resistor R109 and R110.

An NPN transistor Q122, a PNP transistor Q124 and resistors R119, R120 are connected in series in order recited between the power supply potential node Vcc and the ground potential node GND, and base of the NPN transistor Q122 is connected to the node of the resistor R115 and a Zener diode Z103. Moreover, resistor R121, R122 and an NPN transistor Q125 which are connected in series in order recited and a PNP transistor Q126 and resistors R123, R124 which are connected in series in order recited are connected in parallel with the PNP transistor Q124 and the resistors R119, R120 which are connected in series in order recited. Bases of the PNP transistor Q124. Q126 are connected to the node (junction) of the resistor R121 and the resistor R122, base of the NPN transistor Q125 is connected to the node of the resistor R119 and the resistor R120, and this node is connected to the node Vs.

Resistors R116, R117 are connected in series in order recited between the node Vs and the ground potential node GND, and NPN transistor Q119 is connected between the node of the resistor R116 and the resistor R117 and the ground potential node GND, and base of the NPN transistor Q119 is connected to collectors of the PNP transistors Q117 and Q118. A resistor R118 is connected between the node of the resistor R116 and the resistor R117 and emitter of the NPN transistor Q122. In addition, an NPN transistor Q123 is connected between the node Vs and the ground potential node GND, and base of the NPN transistor Q123 is connected to collector of the NPN transistor Q119.

A resistor R126 and NPN transistors Q127, Q128 are connected in series in order recited between high potential side node of reference voltage source V1 and the ground potential node GND, and bases and collectors of the NPN transistors Q127, Q128 are respectively connected to each other. A resistor R127 is connected between emitter of an NPN transistor Q130 of which base is connected to base of the NPN transistor Q127 and the ground potential node GND, and collector of the NPN transistor Q130 is connected to bias constant current source element of the output amplifier circuit. A resistor R125 is connected between base of NPN transistor Q129 connected between bases of the NPN transistors Q127, Q130 and the ground potential node GND and node of the resistor R123 and the resistor R124.

The load short-circuit protective operation of the conventional output power amplifier circuit shown in FIG. 6 is as follows. As described above, the transistors Q101 and Q102 are respective output transistors of the class B push-pull output power amplifier circuit. The circuit composed of transistors Q103 to Q110, resistors R101 the R108, Zener diodes Z101, Z102 and d.c. voltage source Vsat1 is a circuit section for detecting output transistor power at the time of short-circuit. At the time of short-circuit with respect to ground potential node GND, power detection is carried out by transistors Q103, Q104 and Q106 to Q108, resistors R101, R103, R04, R107 and R108. Zener diode Z101 and d.c. voltage source Vsat1. At the time of short-circuit with respect to power supply potential node Vcc, power detection is carried out by transistors Q105, Q109, Q110, resistors R102, R105, R106, and Zener diode Z102. Moreover, the circuit composed of transistors Q122 to Q126, resistors R115 to R124 and Zener diode Z103 is a thyristor circuit for maintaining protective operation at the time of short-circuit, and the circuit composed of transistors Q111 to Q121, resistors R109 to R114 and d.c. (power supply) voltage source Vsat2 is a reset circuit for thyristor and serves to carry out output voltage detection. Transistors Q127, Q128, Q130, resistors R126, R127 and reference voltage source V1 are a bias constant current source circuit, and transistor Q129 and resistor R125 are a circuit for cutting off supply of bias current to the power amplifier circuit as protective operation. Voltages of d.c. voltage sources Vsat1, Vsat2 are saturation voltages of PNP switch transistors. Voltage of the d.c. voltage source V1 is set so that potentials of bases of the NPN transistors Q127, Q130 are equal to 2VF which is double of forward voltage of the NPN transistor Q130.

In order to carry out protective operation, it is first required to detect collector-emitter voltage Vce and collector current Ic, i.e., power of each of output transistors Q101, Q102 adapted so that each transistor is short-circuited with power supply potential node Vcc or ground potential node GND and large current is caused to flow therethrough. When detected power is above set sensitivity level and output voltage Vout is caused to fall within set range, transistor Q108 or transistors Q109, Q110 and transistor Q119 are turned ON so that thyristor is turned ON. Thus, the transistor Q129 is turned ON and the transistor Q130 is turned OFF to carry out protective operation for a time period during which the output transistor is short-circuited.

The more practical protective circuit operation at the time when output is short-circuited with power supply potential node Vcc will now be described. Initially, the condition for allowing transistors Q109 and Q110 to be turned ON at the power detecting section is satisfied when voltage across the resistor R105 becomes above Vs(Z102+ (VF(Q109), and is expressed as follows.

(R105/(R105+R106))×Vout+((R105×R106)/(R105+ R106))×Ic(Q105)>Vz(Z102)+VF(Q109)

In the above-mentioned expression, it is assumed that Vz is reverse (backward) voltage of the Zener diode and VF is forward voltage of the transistor.

Moreover, the transistor Q105 constitutes current mirror along with the transistor Q102 and collector current Ic (Q102) is determined by the following expression (formula).

IC(Q105)=1/Re (Q102)×(R102×Ic (Q105)+VT×ln ((Se ((Q102)/Se (Q105)×IC (Q105))/Ic (Q102))

In the above relational expression, it is assumed that Re is internal emitter resistance (value) of the transistor and Se is base emitter junction area, and VT(=kT/q) is thermal voltage.

Further in order to allow the transistor Q119 to be turned ON at the voltage detecting section, transistor Q118. Q120 must be turned ON, and the condition therefor is expressed as follows when saturation voltage Vsat2=0

Vout>Vcc−(Vcc−4Vbe)×R109/(R109+R110+R111))

where, 4Vbe is addition of base-emitter voltages of the transistors Q111−Q114.

In the case where the above-mentioned condition is satisfied, transistors Q109, Q110 and transistor Q119 are turned ON so that the thyristor is turned ON. Thus, the transistor Q129 is turned ON and transistor Q130 is turned OFF to carry out protective operation for a time period during which output transistor is short-circuited.

Though in the above-mentioned example, a protective operation for output short-circuit with respect to the power supply node is described, however, a protective operation for output short-circuit with respect to ground potential node is based on similar principle.

Figure 7:
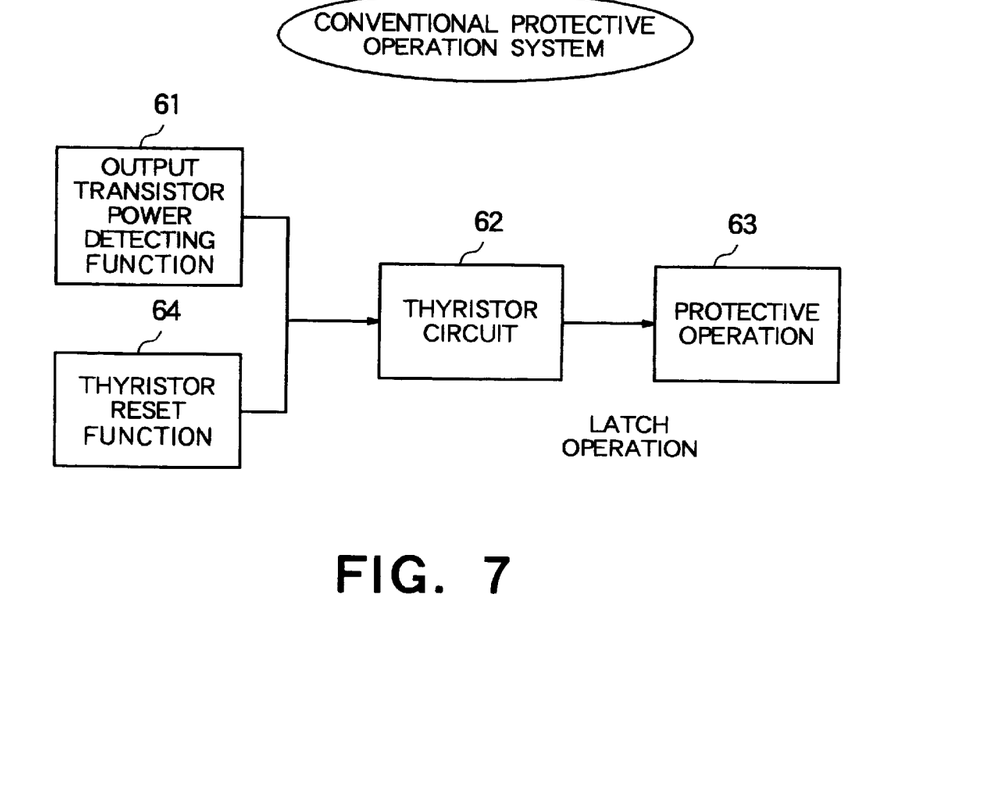
FIG. 7 is an explanatory diagram showing, in a model form, short-circuit protective operation of the conventional short-circuit protective function in an output power amplifier circuit.

FIG. 7 is an explanatory diagram showing, in a model form, the short-circuit protective operation system of the conventional output power amplifier circuit. As described above, output transistor power detecting function 61 carries out power detection of the output transistor so that thyristor circuit 62 carries out latch operation. Thus, protective operation (output section) 63 is maintained (operative) for a time period during which the output transistor is short-circuited with power supply potential node Vcc or ground potential node GND. In addition, when thyristor reset function 64 detects output voltage and it becomes unnecessary to maintain latch operation of the thyristor circuit 62, it resets (releases) latch operation of the thyristor circuit 62.

However, in the conventional short-circuit protective function, in the case where output is short-circuited by wire including resistance component, the following two problems exist.

Figure 8:
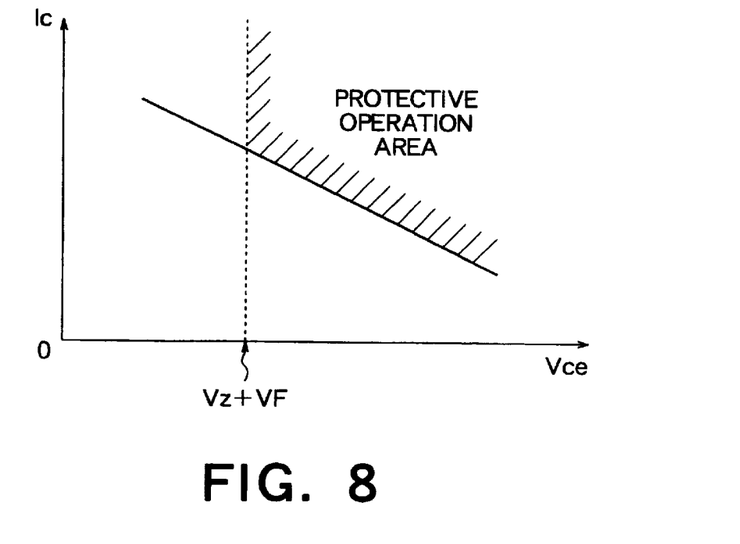
FIG. 8 is a graph showing protective sensitivity curve of the conventional short-circuit protective circuit device.

FIG. 8 is a graph showing protective sensitivity curve of conventional short-circuit protective function.

First, in the case where output is short-circuited with power supply potential node Vcc, when output is short-circuited by wire including resistance component, large current is caused to flow, and voltage drop thus takes place across both ends of wire. As a result, Vout<Vcc holds. Therefore, when collector-emitter voltage Vcc of the transistor Q102 is less than Vz (Z102)+VF (Q109), it is important to carry out power detection.

Secondly, in the case where the inequality expressed as Vcc−Vout>V(R109) holds in the voltage detection, detection is not caused to fall within of the detection range. As a result, the transistor Q119 cannot be turned ON.

SUMMARY OF THE INVENTION

An object of the invention is to provide a protective circuit device for load short-circuit having broad protective operation range and capable of maintaining protective operation until short-circuit of output transistor is released (reset) in the state where no thyristor circuit is used.

According to the first aspect of this invention, there is provided an output power amplifier circuit comprising:

an output transistor for generating power amplified signal;

a detection circuit for detecting a collector current and a collector voltage of said output transistor; and a protective operation circuit for performing protective operation for said output transistor when the current detected by said detection circuit reach predetermined current value and the voltage detected by said detection circuit enters within a set value range.

According to the second aspect of this invention, there is provided an output power amplifier circuit, comprising a first output transistor and a second output transistor connected push-pull manner for producing a power amplified signal;

a detecting circuit for detecting a collector current and a collector voltage of at least one of said first output transistor and said second output transistor; and a protective operation circuit performing a protective operation for the output transistors when, under the state where a collector of said first or second output transistors is short-circuited with a predetermined low impedance node, collector current value of one of the first or second output transistors reaches a predetermined set current value and the collector voltage value of the transistor is caused to fall within a predetermined set range.

According to the third aspect of the present invention, there is provided an output power amplifier circuit comprising:

first and second transistor connected push-pull manner for producing a power amplified signal;

third and fourth transistors for respectively constituting current mirror along with the first and second transistors;

first and sixth transistors for respectively producing reference currents in collector current detection of the third and fourth transistors;

a seventh transistor for comparing a collector voltage of the first transistor with a first comparative voltage when a collector current of the third transistor and a collector current of the fifth transistor become substantially the same;

an eighth transistor for comparing a collector voltage of the second transistor with a second comparative voltage when a collector current of the fourth transistor and a collector current of the sixth transistor become substantially the same;

a bias constant current source circuit for supplying a bias constant current to the first and second transistors at the time of normal operation;

a bias constant current stop circuit adapted so that when the eighth transistor turns off based on the comparative operation of a collector voltage of the second transistor with the second comparative voltage under the state where the collector of the first transistor is short-circuited with a predetermined power supply potential node, or when the seventh transistor turns off based on the comparative operation of a collector voltage of the first transistor with the first comparative voltage under the state where the collector of the second transistors is short-circuited with a predetermined ground potential node, it stops supply of the bias constant current;

a first protective operation maintaining circuit adapted so that, for a time period during which the collector of the first transistor is short-circuited with the predetermined power supply potential node, even when collector current of the fourth transistor becomes smaller than collector current of the sixth transistor, it maintains stopping supply of the bias constant current by the bias constant current stop circuit; and a second protective operation maintaining circuit adapted so that, for a time period during which collector of the second transistor is short-circuited with the predetermined ground potential node, even when collector current of the third transistor becomes smaller than collector current of the fifth transistor, it maintains stopping supply of the bias constant current by the bias constant current stop circuit

DESCRIPTION OF THE PREFERRED EMBODIMENTS

Preferred embodiments of an output power amplifier circuit according to this invention will now be described.

Figure 1A:
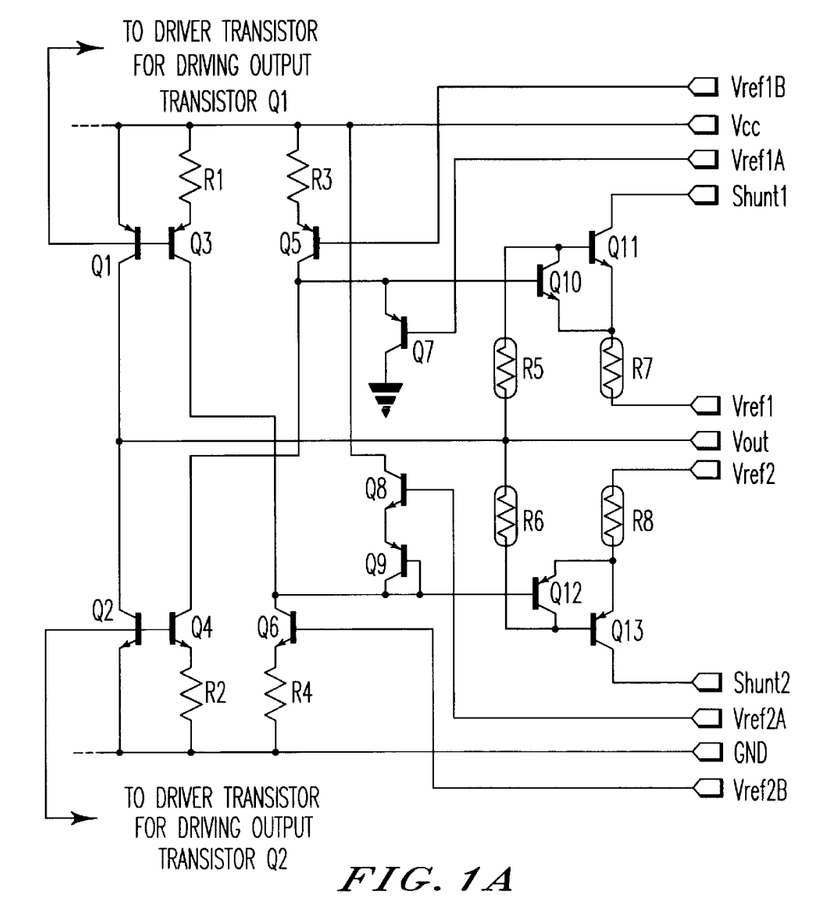
FIG. 1 is a circuit diagram of an output power amplifier circuit according to a first embodiment of the present invention.
Figure 1B:
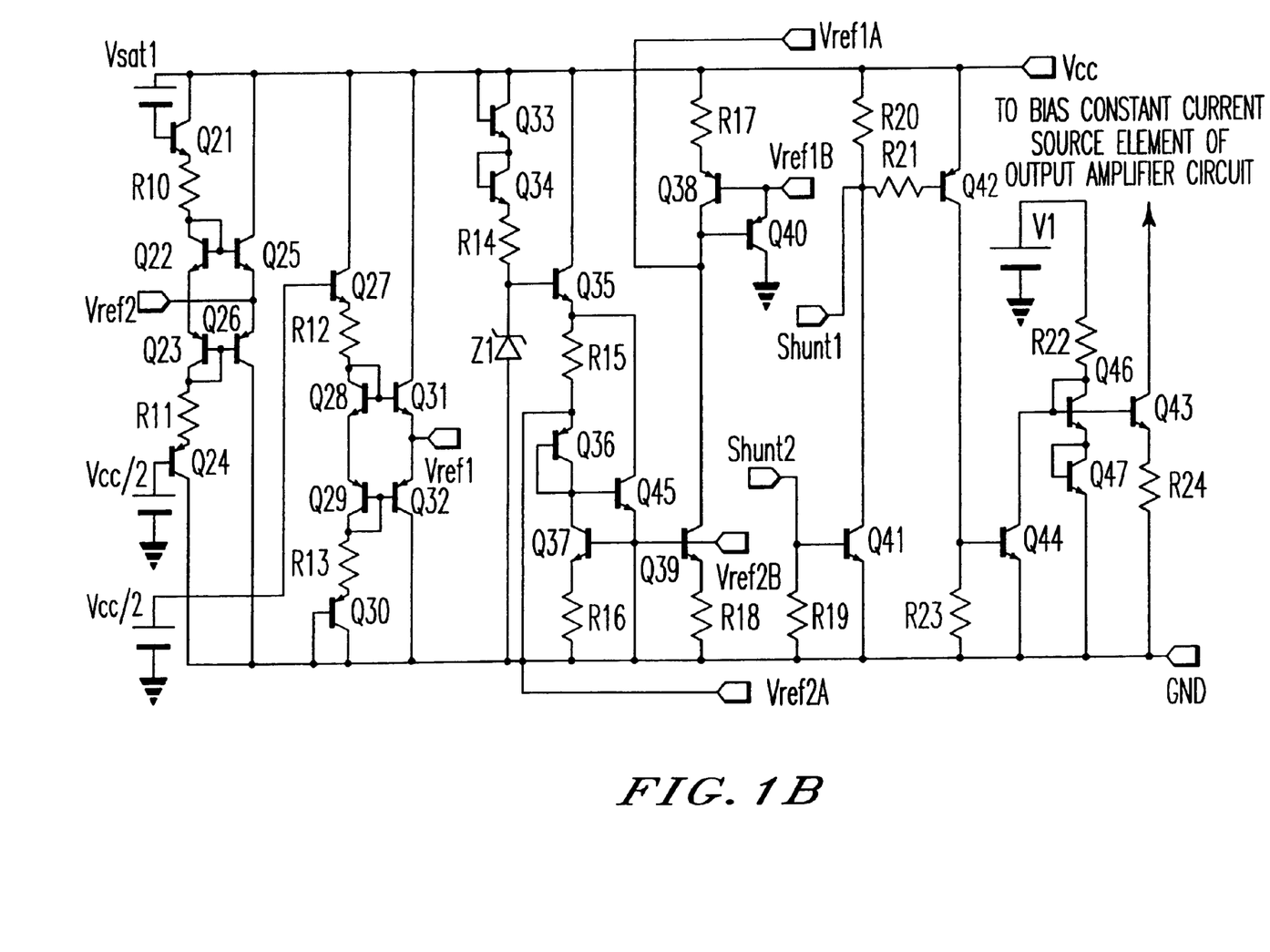

FIG. 1 is a circuit diagram of an output power amplifier circuit with short-circuit protective function according to the first embodiment of this invention. The connections of the output power amplifier circuit according to the first embodiment of this invention shown in FIG. 1 is as follows. A PNP transistor Q1 and an NPN transistor Q2 are connected in series in order recited between power supply potential node Vcc and ground potential node GND, and node of collector of the PNP transistor Q1 and collector of the NPN transistor Q2 is caused to serve as output potential node Vout. As described later, the transistor Q1 and Q2 are respective output transistors of class B push-pull output power amplifier circuit, and bases of the transistors Q1 and Q2 are respectively connected to driver transistors for driving the transistors Q1 and Q2.

A resistor R1, a PNP transistor Q3, and NPN transistor Q6 and a resistor R4 which are connected in series in order recited and a resistor R3, a PNP transistor Q5, an NPN transistor Q4 and a resistor R2 which are connected in series in order recited are respectively connected in parallel with the PNP transistor Q1 and the NPN transistor Q2 which are connected in series in order recited. Base of the PNP transistor Q3 and base of the PNP transistor Q1 are connected to each other, and base of the NPN transistor Q4 and base of the NPN transistor Q2 are connected to each other. Reference potentials Vref1B, Vref2B are applied to bases of PNP transistor Q5 and the NPN transistor Q6.

A PNP transistor Q7 is connected between collector of the PNP transistor Q5 and ground potential terminal (node) GND, and reference potential Vref1A is applied to base of the PNP transistor Q7. An NPN transistor Q8 and a PNP transistor Q9 are connected in series in order recited between power supply potential node Vcc and collector of the NPN transistor Q6. Reference potential Vref2A is applied to base of the NPN transistor Q8, and base and collector of the PNP transistor Q9 are connected to each other.

One end of a resistor R7 is connected to emitter of the NPN transistor Q11 of which collector potential is caused to be control potential Shunt1, and reference potential Vref1 is applied to the other end of the resistor R7. An NPN transistor Q10 is connected between the base and the emitter of the NPN transistor Q11, and base of the NPN transistor Q10 is connected to collector of the PNP transistor Q5 and emitter of the NPN transistor Q7. A resistor R5 is connected between base of the NPN transistor Q11 and collector of the NPN transistor Q10 and output potential node Vout.

Emitter of a PNP transistor Q13 is connected to the other end of a resistor R8 adapted so that reference potential Vref2 is applied to one end thereof, and collector potential of a PNP transistor Q13 is caused to be control potential shunt2. A PNP transistor Q12 is connected between emitter and base of the PNP transistor Q13, and base of the PNP transistor Q12 is connected to base and collector of the PNP transistor Q9 and collectors of the PNP transistor Q3 and the NPN transistor Q6. A resistor R6 is connected between base of the PNP transistor Q13, collector of the PNP transistor Q12 and output potential node Vout.

Moreover, an NPN transistor Q21, a resistor R10, an NPN transistor Q22, a PNP transistor Q23, a resistor R11 and a PNP transistor Q24 are connected in series in order recited between the power supply potential node Vcc and the ground potential node GND. Moreover, d.c. potential voltage source Vsat1 is connected between base and collector of the NPN transistor Q21. Bases and collectors of the NPN transistor Q22 and the PNP transistor Q23 are respectively connected to each other. Potential Vcc/2 which is one half of the power supply potential Vcc/2 is applied to base of the PNP transistor Q24.

An NPN transistor Q25 and a PNP transistor Q26 which are connected in series in order recited are connected in parallel with the NPN transistor Q21, the resistor R10, the NPN transistor Q22, the PNP transistor Q23, the resistor R11 and the PNP transistor Q24 which are connected in series in order recited. Base of the NPN transistor Q25 is connected to both collector and base of the NPN transistor Q22, and base of the PNP transistor Q26 is connected both collector and base of the PNP transistor Q23. Emitter potentials of the NPN transistor Q25 and the PNP transistor Q26 are caused to be reference voltage Vref2.

An NPN transistor Q27, a resistor R12, an NPN transistor Q28, a PNP transistor Q129, a resistor R13 and a PNP transistor Q30 are connected in series in order recited between the power supply potential node Vcc and the ground potential node GND. Potential Vcc/2 which is one half of reference potential Vcc is applied to base of the NPN transistor Q27, and bases and collectors of the NPN transistor Q28, the PNP transistor Q129 and the PNP transistor Q30 are respectively connected to each other.

An NPN transistor Q31 and a PNP transistor Q32 which are connected in series in order recited are connected in parallel with the NPN transistor Q27, the resistor R12, the NPN transistor Q28, the PNP transistor Q129, the resistor R13 and the PNP transistor Q30. Base of the NPN transistor Q31 is connected to both collector and base of the NPN transistor Q28, and base of the PNP transistor Q32 is connected to both collector and base of the PNP transistor Q129. Emitter potentials of the NPN transistor Q31 and the PNP transistor Q32 are caused to serve as reference voltage Vref1.

NPN transistors Q33, Q34, a resistor R14 and a Zener diode Z1 are connected in series in order recited between the power supply potential node Vcc and the ground potential node GND, and collectors and bases of the NPN transistors Q33, Q34 are respectively connected to each other.

An NPN transistor Q35, a resistor R15, a PNP transistor Q36, an NPN transistor Q37 and a resistor R16 are connected in series between the power supply potential node Vcc and the ground potential node GND. Base of the NPN transistor Q35 is connected to the node of the resistor R14 and the Zener diode Z1. Base and collector of the PNP transistor Q36 are connected to each other. An NPN transistor Q45 is connected between emitter of the NPN transistor Q35 and base of the NPN transistor Q37, and base of the NPN transistor Q45 is connected to collectors of the PNP transistor 36 and the NPN transistor Q37. Emitter potential of the PNP transistor Q36 is caused to serve as reference potential Vref2A and emitter potential of the NPN transistor Q45 is caused to serve as reference potential Vref2B.

A resistor R17, a PNP transistor Q38, an NPN transistor Q39 and a resistor R18 are connected in series in order recited between the power supply potential node Vcc and the ground potential node GND. A PNP transistor Q40 is connected between base of the PNP transistor Q38 and ground potential terminal (node) GND. Base of a PNP transistor Q40 is connected to collector of the PNP transistor Q38. Base of the NPN transistor Q39 is connected to emitter of the NPN transistor Q45. Collector potentials of the PNP transistor Q38 and the NPN transistor Q39 are caused to be reference potential Vref1A and emitter potential of the PNP transistor Q40 is caused to be reference potential Vref1B.

A resistor R20 and an NPN transistor Q41 are connected in series in order recited between the power supply potential node Vcc and the ground potential node GND, and a resistor R19 is connected between base of the NPN transistor Q41 and the ground potential node GND. Control potential Shunt2 is applied to base of the NPN transistor Q41.

A PNP transistor Q42 and a resistor R23 are connected in series in order recited between the power supply potential node Vcc and the ground potential node GND, and a resistor R21 is connected between the node of the resistor R20 and collector of an NPN transistor Q41 and base of the PNP transistor Q42. Control potential shunt1 is applied to the node where the resistor 20, collector of the NPN transistor Q41 and resistor R21 are connected.

A resistor R22 and NPN transistors Q46, Q47 are connected in series in order recited, a predetermined potential V1 is applied to one end of the resistor R22 by reference voltage source V1, and emitter of the NPN transistor Q47 is connected to the ground potential node GND. Bases and collectors of the NPN transistors Q46, Q47 are respectively connected to each other. An NPN transistor Q44 is connected between base and collector of the NPN transistor Q46 and the ground potential node GND, and base of the NPN transistor Q44 is connected to the node of collector of the PNP transistor Q42 and a resistor R23. A resistor R24 is connected between emitter of an NPN transistor Q43 of which base is connected to base and collector of the NPN transistor Q46 and the ground potential node GND, and collector of an NPN transistor Q43 is connected to bias constant current source element of the output amplifier circuit. Voltage of the reference voltage source V1 is set so that collector potential of the NPN transistor Q46 becomes equal to 2VF which is double of forward voltage VF of the NPN transistor.

The function of the load short-circuit protective circuit device according to the first embodiment of this invention shown in FIG. 1 is as follows. As described above, the transistors Q1 and Q2 are respectively output transistors of the class B push-pull output power amplifier circuit. The circuit composed of transistor Q3 to Q13 and Q21 to Q40, resistors R1 to R8 and R10 to R18, Zener diode Z1, and d.c. voltage source Vsat1 is a circuit for detecting current and voltage of output transistor at the time of short-circuit; the circuit composed of transistors Q43, Q46, Q47, resistors R22, R24 and reference voltage source. V1 is a bias contact current source circuit; and the circuit composed of transistors Q41, Q42, Q44 and resistors R19 to R23 is a circuit for cutting off supply of the bias current to the power amplifier circuit as protective operation. Thus, at the time of short-circuit with respect to ground potential node GND, voltage detection is carried out by the circuit composed of transistors Q3, Q6, Q8, Q9, Q12 and Q13, reference potential (voltage) Vref2, and resistors R1, R4, R6, R8. On the other hand, at the time of short-circuit with respect to power supply potential node Vcc, voltage detection is carried out by the circuit composed of transistors Q4, Q5, Q7, Q10 and Q11, reference potential (voltage) Vref1, resistors R2 and R3, R5, R7. Moreover, the circuit composed of transistors Q21 to Q32 and resistors R10 to R13 is a circuit for producing reference potentials Vref1, Vref2 determined in accordance with power supply potential Vcc, and the circuit composed of transistors Q33 to Q40, resistors R14 to R18 and Zener diode Z1 is a circuit for producing reference potentials Vref1B, Vref2B to thereby produce reference current in current detection of the circuit for detecting current and voltage of the output transistor at the time of short-circuit. In addition, transistors Q7 to Q9 are elements for maintaining protective operation at the time of short-circuit, and reference potentials Vref1A, Vref2A for controlling transistors Q7, Q8 are given by the circuit composed of transistors Q33 to Q40, resistors R14 to R18, and Zener diode Z1.

The fundamental operation of the load short-circuit protective function of the output power supply circuit according to the first embodiment is as follows. When collector current Ic of the output transistor short-circuited with power supply potential node Vcc or ground potential node GND and adapted for allowing large current to flow reaches set reference current value and output voltage is caused to flow within set range, transistor Q11 or Q13 is turned ON so that transistors Q41, Q42, Q44 are turned ON and transistor Q43 is turned OFF. As a result, protective operation is carried out for a time period during which the output transistor is short-circuited.

The protective operation at the time when a short-circuit with respect to power supply potential node Vcc occurs will now be described more practically.

Initially, the condition that transistor Q11 is turned ON at the current/voltage detecting section is that the relationship (condition) expressed as Vout>Vref1+VF(Q11) is satisfied and the transistor Q10 is an OFF state. In this case, VF is assumed to be forward voltage of transistor. The condition for allowing the transistor Q10 to be turned OFF is that collector current of the transistor Q5 serving as reference current and collector current of the transistor Q4 are equal to each other i.e., IC(Q4)=Ic(Q5) holds. The transistor Q4 constitutes current mirror along with the output transistor Q2, and collector current Ic(Q2) of the transistor Q2 is determined by the following formula.

Ic(Q2)=1/Re(Q2)×(R2×Ic(Q4)+VT×1n ((Se(Q2)/Se(Q4)×Ic(Q4))/Ic(Q2)))

where, Re is emitter resistor in the transistor, Se is base/emitter junction area, and VT(=kT/q) is thermal voltage.

In addition, reference potential Vref1 is determined by the following formula.

Vref1=((Vcc/2−4Vbe)×(R13/(R12+R13)))+2Vbe where, 4Vbe is addition of base-emitter voltages of the transistors Q27–Q30 and 2Vbe is addition of base-emitter voltages of the transistors Q31 and Q32.

In the case where the above-mentioned condition is satisfied, the transistor Q11 is turned ON so that transistors Q41, Q42 and Q44 are turned ON and the transistor Q43 is turned OFF, thus to carry out protective operation.

It is to be noted that the principle of the protective operation at the time of short-circuit of output with respect to ground potential node GND is the same.

Explanation will now be given in connection with latch operation at the time of short-circuit in the case of short-circuit with respect to the power supply potential node Vcc. In the normal state, collector current Ic(Q4) is smaller than reference current Ic(Q5), and the transistor Q10 is in ON state and the transistor Q11 is in OFF state.

After short-circuit of the output transistor, Ic(Q4)=Ic(Q5) holds. Accordingly, the transistor Q10 is turned OFF and the transistor Q11 is turned ON. Thus, the operation mode enters the protective operation so that the transistors Q41, Q42, Q44 are turned ON and the transistor Q43 is turned OFF. As a result, bias by the bias constant current source circuit is turned OFF and collector currents Ic(Q2) and Ic(Q4) are cut (turned) OFF. In this case, the transistor Q7 serves to fix base potential of the transistor Q10 for a time period during which Ic(Q4)<Ic(Q5) holds so that it becomes equal to Vcc-VF-(R17). Also immediately after bias is turned OFF so that collector current Ic(Q4) is cut (turned) OFF, base potential becomes the same potential. However, because the transistor Q11 is turned OFF, emitter potential Ve of the transistor Q10 is maintained at Vcc-VF-V(R5). Accordingly, base-emitter voltage Vbe of the transistor Q10 becomes equal to V(R17)−V(R5). Since this voltage Vbe is set so that it is smaller than VF(Q10), the transistor Q10 cannot be turned ON. Namely, although the circuit device is in the state of Ic(Q4)<Ic(Q5), the transistor Q10 is in OFF state. As a result, protective state is maintained until short-circuit of the output transistor is released (reset).

Figure 2:
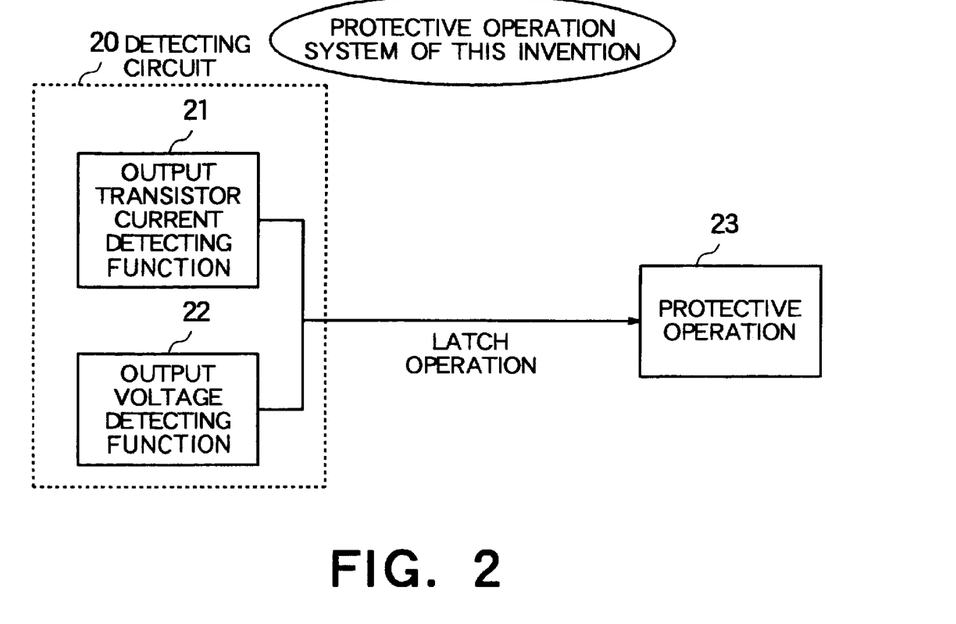
FIG. 2 is an explanatory diagram showing, in a model form, protective operation system of the short-circuit protection function in the output power amplifier circuit according to present invention.

FIG. 2 is an explanatory view showing, in a model form, the protective operation system in the output power amplifier circuit according to this invention. As described above, output transistor current detection function 21 included in detection circuit 20 carries out current detection of the output transistor, whereby the detection circuit 20 carries out latch operation. Thus, protective operation indicated by reference numeral 23 is maintained for a time period during which the output transistor is short-circuited with the power supply potential node Vcc or the ground potential node GND. In addition, output voltage detection function 22 included in the detection circuit 20 carries out detection of output voltage. When it becomes unnecessary to maintain latch operation, the output voltage detection function 22 releases (resets) latch operation.

Figure 3:
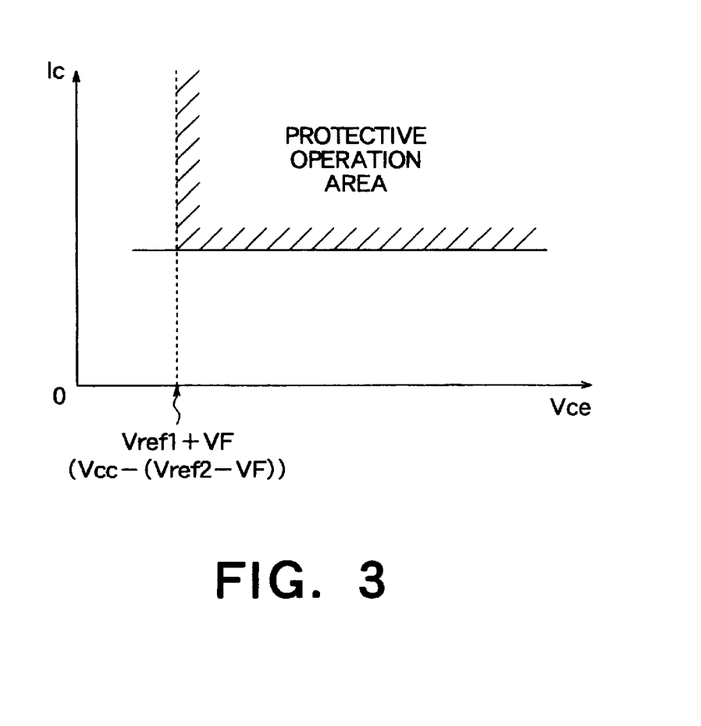
FIG. 3 is a graph showing protective sensitivity curve of the short-circuit protective function according to this invention.

FIG. 3 is a graph showing protective sensitivity curve of the load short-circuit protective function of the output power amplifier circuit according to this invention. Since this short-circuit protective function carries out protective operation for a time period during which the output transistor is short-circuited when collector current Ic of the output transistor reaches set reference current value and output voltage (collector voltage of the output transistor) is caused to fall within the set range, the region as shown in FIG. 3 results in protective operation area.

As previously described, the conventional short-circuit protective function cannot carry out power detection when output transistor collector-emitter voltage Vce is less than Vz(Z2)+VF(Q9) because of voltage drop produced in wire for short-circuit of output with respect to power supply potential node Vcc. As a result, conventional circuit device could not carry out protective operation. On the contrary, the load short-circuit protective function of the output power amplifier circuit according to this invention can carry out protective operation if output transistor collector-emitter voltage Vce is larger than Vref1+VF. Similarly, for the short-circuit with respect to ground potential node, the load short-circuit protective function according to this invention can carry out protective operation if output transistor collector-emitter voltage Vce is larger than Vcc−(Vref2−VF).

In addition, since the conventional load short-circuit protective function detects output power of the output transistor, this circuit device could not carry out protective operation unless larger collector current is caused to flow in accordance with drop of output transistor collector-emitter voltage Vce as shown in FIG. 8. On the contrary, the load short-circuit protective circuit device according to this invention can carry out protective operation of the output transistor if value of output transistor collector-emitter voltage Vce is caused to fall within the set range when collector current Ic is a predetermined set current value or more.

Figure 4A:
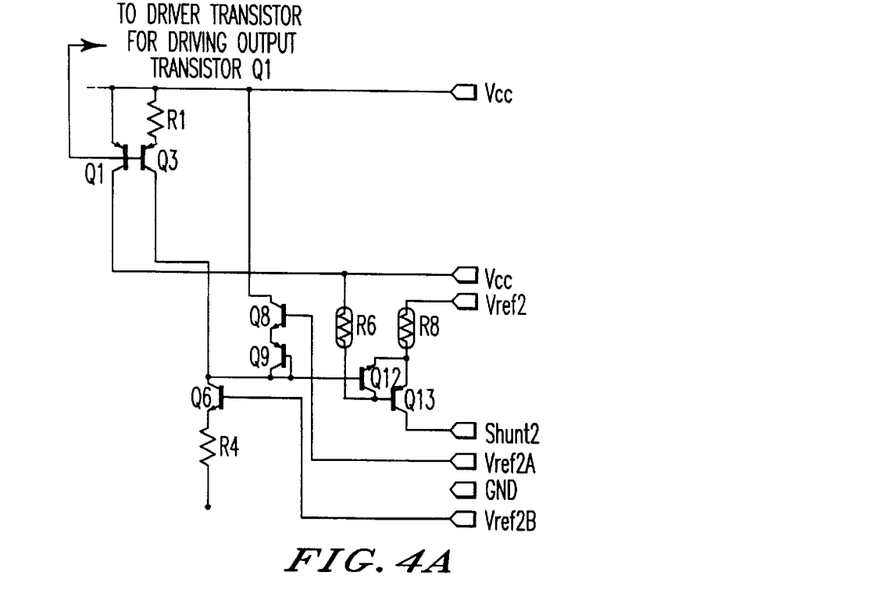
FIG. 4 is a circuit diagram of an output power amplifier circuit according to a second embodiment of the present invention.
Figure 4B:
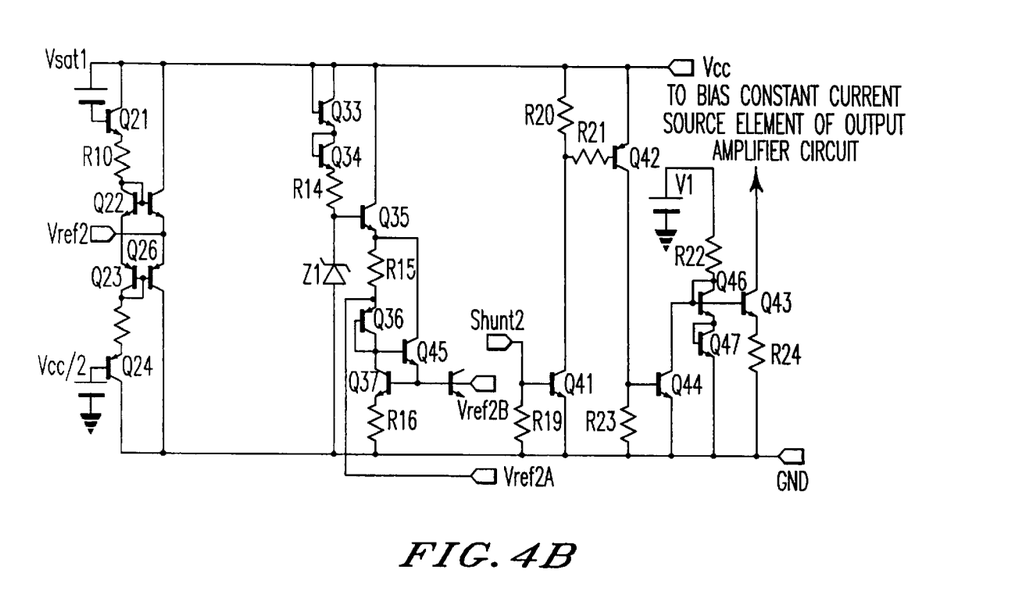

FIG. 4 is a circuit diagram showing a second embodiment of the output circuit amplifier circuit according to the present invention.

In this embodiment, one transistor is employed as an output transistor, and the protective operation is carried out if output transistor collector-emitter voltage Vce is larger than Vcc−(Vref2−VF) for the short-circuit with respect to the ground potential node GND.

The circuit configuration shown in FIG. 4 is obtained by removing unnecessary elements for the above-mentioned protective operation from the circuit configuration shown in FIG. 1 to remain necessary elements for the protective operation. Since circuit configuration and operation are same as in FIG. 1, detailed explanation will be omitted.

Figure 5A:
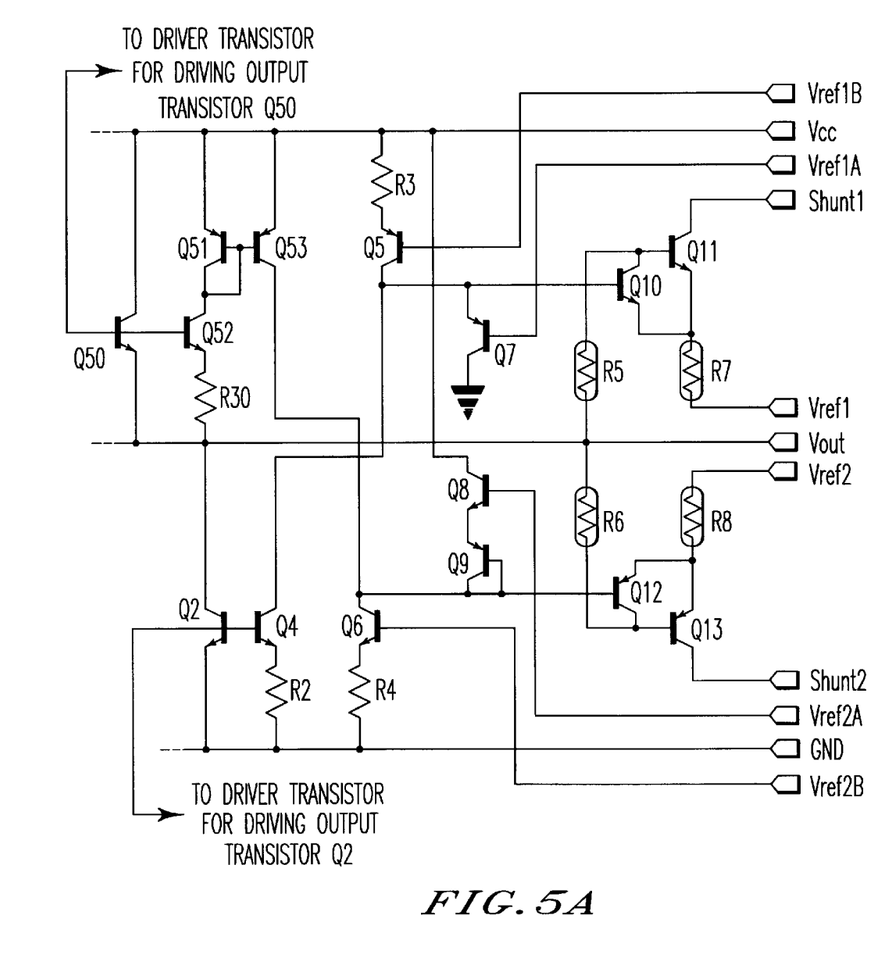
FIG. 5 is a circuit diagram of an output power amplifier circuit according to a third embodiment of this invention.
Figure 5B:
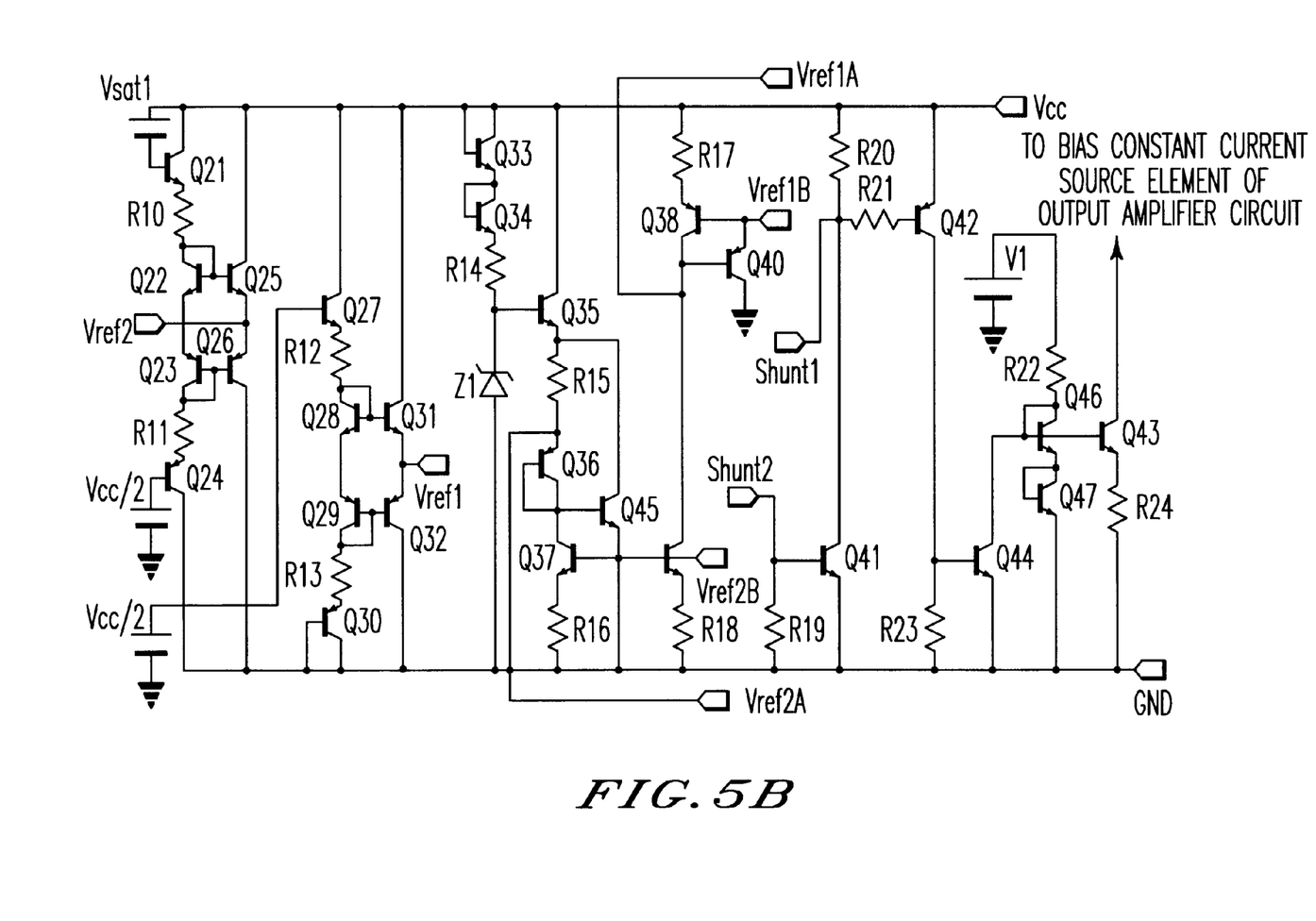

FIG. 5 is a circuit diagram of the output power amplifier circuit with short-circuit protective function according to the third embodiment of this invention. The output power amplifier circuit according to the third embodiment of this invention shown in FIG. 5 is characterized in that the circuit of the portion composed of PNP transistor Q1 serving as output transistor, resistor R1 and PNP transistor Q3 in the first embodiment of FIG. 1 is replaced by the following circuit. Namely, an NPN transistor Q50 and NPN transistor Q2 are connected is series in order recited as the output transistor between power supply potential node Vcc and ground potential node GND. A PNP transistor Q51, an NPN transistor Q52 and a resistor R30 which are connected in series in order recited are connected in parallel with the NPN transistor Q50. Base and collector of the NPN transistor Q51 are connected to each other. A PNP transistor Q53 is connected between power supply potential node Vcc and collector of NPN transistor Q6, base of the PNP transistor Q53 is connected to base and collector of the NPN transistor Q51, and the PNP transistors Q51 and Q53 constitute current mirror. Configurations of other portions are similar to those of the first embodiment of FIG. 1 and the fundamental operation principle as the load short-circuit protective circuit device is also the same as above.

In accordance with the output power amplifier circuit according to this invention, it comprises and output transistor, a detection circuit for detecting a collector current and a collector voltage of the output transistor, and a protective operation circuit for performing protective operation for said output transistor when the current detected by said detection circuit reach predetermined current value and the voltage detected by said detection circuit enters within a set value range.

As a result, the protective operation range is extended. Thus, even also in the case where collector of the output transistor is short-circuited by low output transistor collector-emitter voltage Vce, it is possible to securely detect abnormal state to carry out protective operation. Further, also in the case where such output transistor is short-circuited by wire including resistance component, it is possible to securely carry out protective operation. In addition, protective operation can be continued for a time period during which such output transistor is short-circuited.

What is claimed is:

1. An output power amplifier circuit comprising:

an output transistor for generating power amplified signal;

a detection circuit for detecting a collector current and a collector voltage of said output transistor; and a protective operation circuit for performing protective operation for said output transistor when the current detected by said detection circuit reach predetermined current value and the voltage detected by said detection circuit enters within a set value range.

2. The output power amplifier circuit according to claim 1, wherein said protective operation circuit performs cutting off supply of bias current to said output transistor.

3. The output power amplifier circuit according to claim 1, wherein said detection circuit detects the collector current by monitoring current flowing through a current mirror circuit which is provided for said output transistor.

4. The output power amplifier circuit according to claim 3, wherein said detection circuit further comprises a reference current source for generating a reference current used for monitoring current flowing said current mirror circuit.

5. The output power amplifier circuit according to claim 1, wherein said detection circuit detects the collector voltage by monitoring it using a reference voltage which depends on a power supply voltage.

6. An output power amplifier circuit, comprising a first output transistor and a second output transistor connected push-pull manner for producing a power amplified signal;

a detecting circuit for detecting a collector current and a collector voltage of at least one of said first output transistor and said second output transistor; and a protective operation circuit performing a protective operation for the output transistors when, under the state where a collector of said first or second output transistors is short-circuited with a predetermined low impedance node, collector current value of one of the first or second output transistors reaches a predetermined set current value and the collector voltage value of the transistor is caused to fall within a predetermined set range.

7. The output power amplifier circuit according to claim 6, wherein said first output transistor is of a PNP type and said second output transistor is of an NPN type.

8. The output power amplifier circuit according to claim 6, wherein said first output transistor is of an NPN type and said second output transistor is of an NPN type.

9. The output power amplified circuit according to claim 6, wherein said detecting circuit comprises a first detecting section for detecting collector current and voltage of said first output transistor and a second detecting section for detecting collector current and voltage of said second output transistor.

10. The output power amplifier circuit according to claim 6, wherein said protective operation circuit performs cutting off supply of bias current to said output transistor.

11. The output power amplifier circuit according to claim 6, wherein said detection circuit detects the collector current by monitoring current flowing through a current mirror circuit which is provided for said output transistor.

12. The output power amplifier circuit according to claim 11, wherein said detection circuit further comprises a reference current source for generating a reference current used for monitoring current flowing said current mirror circuit.

13. The output power amplifier circuit according to claim 6, wherein said detection circuit detects the collector voltage by monitoring it using a reference voltage which depends on a power supply voltage.

14. The output power amplifier circuit according to claim 6, wherein the protective operation is maintained for a time period when the collectors of the output transistors are short-circuited with the low impedance node.

15. An output power amplifier circuit comprising:

first and second transistor connected push-pull manner for producing a power amplified signal;

third and fourth transistors for respectively constituting current mirror along with the first and second transistors;

fifth and sixth transistors for respectively producing reference currents in collector current detection of the third and fourth transistors;

a seventh transistor for comparing a collector voltage of the first transistor with a first comparative voltage when a collector current of the third transistor and a collector current of the fifth transistor become substantially the same;

an eighth transistor for comparing a collector voltage of the second transistor with a second comparative voltage when a collector current of the fourth transistor and a collector current of the sixth transistor become substantially the same;

a bias constant current source circuit for supplying a bias constant current to the first and second transistors at the time of normal operation;

a bias constant current stop circuit adapted so that when the eighth transistor turns off based on the comparative operation of a collector voltage of the second transistor with the second comparative voltage under the state where the collector of the first transistor is short-circuited with a predetermined power supply potential node, or when the seventh transistor turns off based on the comparative operation of a collector voltage of the first transistor with the first comparative voltage under the state where the collector of the second transistors is short-circuited with a predetermined ground potential node, it stops supply of the bias constant current;

a first protective operation maintaining circuit adapted so that, for a time period during which the collector of the first transistor is short-circuited with the predetermined power supply potential node, even when collector current of the fourth transistor becomes smaller than collector current of the sixth transistor, it maintains stopping supply of the bias constant current by the bias constant current stop circuit; and a second protective operation maintaining circuit adapted so that, for a time period during which collector of the second transistor is short-circuited with the predetermined ground potential node, even when collector current of the third transistor becomes smaller than collector current of the fifth transistor, it maintains stopping supply of the bias constant current by the bias constant current stop circuit.

16. The output power amplifier circuit according to claim 15, wherein said first protective operation maintaining circuit has a ninth transistor connected between the base and emitter of the eighth transistor, the base thereof being connected to a connection node between the fourth and sixth transistors; and a tenth transistor connected between the base of the ninth transistor and the ground potential node.

17. The output power amplifier circuit according to claim 16, wherein said ninth transistor turns off when collector currents of the fourth and sixth transistors become substantially the same.

18. The output power amplifier circuit according to claim 16, wherein said first protective operation maintaining circuit further comprises a first reference voltage generator which supplies a first reference voltage to the base of the tenth transistor.

19. The output power amplifier circuit according to claim 15, wherein said second protective operation maintaining circuit has an eleventh transistor connected between the base and emitter of the seventh transistor, the base thereof being connected to a connection node between the third and fifth transistors.

20. The output power amplifier circuit according to claim 19, wherein said eleventh transistor turns off when collector currents become substantially the same.

* * * * *